(12) United States Patent
Yang et al.

(10) Patent No.: US 7,800,211 B2
(45) Date of Patent: Sep. 21, 2010

(54) STACKABLE PACKAGE BY USING INTERNAL STACKING MODULES

(75) Inventors: JoungIn Yang, Kyoungkido (KR);
ChoongBin Yim, Kyoungki-do (KR);
KeonTeak Kang, Namyangju (KR);
YoungChul Kim, Kyonggi-do (KR)

(73) Assignee: STATS ChipPAC, Ltd., Singapore (SG)

( * ) Notice: Subject to any disclaimer, the term of this patent is extended or adjusted under 35 U.S.C. 154(b) by 201 days.

(21) Appl. No.: 11/771,086

(22) Filed: Jun. 29, 2007

(65) Prior Publication Data

US 2009/0001540 A1    Jan. 1, 2009

(51) Int. Cl.
*H01L 23/488* (2006.01)
(52) U.S. Cl. .................. 257/686; 257/777; 257/685; 257/687; 257/723; 257/734; 257/E23.023
(58) Field of Classification Search .................. 257/686, 257/777, E23.023, 685, 687, 723, 734
See application file for complete search history.

(56) References Cited

U.S. PATENT DOCUMENTS 6,798,057 B2 * 9/2004 Bolkin et al. ............... 257/686

7,288,434 B2 * 10/2007 Karnezos ..................... 438/109
2004/0113275 A1 * 6/2004 Karnezos ..................... 257/758

* cited by examiner

*Primary Examiner*—Lynne A Gurley
*Assistant Examiner*—Junghwa M Im
(74) *Attorney, Agent, or Firm*—Robert D. Atkins (57) ABSTRACT

A semiconductor package has a substrate with solder balls. A first semiconductor die is disposed on the substrate. A first double side mold (DSM) internal stackable module (ISM) is in physical contact with the first semiconductor die through a first adhesive, such as a film on wire adhesive. A second DSM ISM is in physical contact with the first DSM ISM through a second adhesive. The arrangement of the first and second DSM ISM reduce headroom requirements for the package and increase device packing density. Each DSM ISM has semiconductor die disposed in cavities. An interposer is disposed above the top DSM ISM. Wire bonds connect the semiconductor die and DSM ISMs to the solder balls. An encapsulant surrounds the first semiconductor die and first DSM ISM with an exposed mold area in the encapsulant above the interposer.

17 Claims, 7 Drawing Sheets

STACKABLE PACKAGE BY USING INTERNAL STACKING MODULES

FIELD OF THE INVENTION

The present invention relates in general to semiconductor devices and, more particularly, a stackable semiconductor package using double side mold for internal stacking modules.

BACKGROUND OF THE INVENTION

Semiconductor devices are found in many products used in modern society. Semiconductors find applications in consumer items such as entertainment, communications, and household markets. In the industrial or commercial market, semiconductors are found in military, aviation, automotive, industrial controllers, and office equipment.

The manufacture of semiconductor devices begins with formation of a wafer having a plurality of die. Each die contains hundreds or thousands of transistors and other electrical devices for performing one or more electrical functions. For a given wafer, each die from the wafer typically performs the same electrical function. Front-end manufacturing generally refers to formation of the transistors and other devices on the wafer. Back-end manufacturing refers to cutting or singulating the finished wafer into the individual die and then packaging the die for electrical interconnect, structural support, and environmental isolation.

The package has external metal contacts for transferring electrical signals into and out of the die. The die has a number of bonding pads, which are connected to the external contacts of the package by wire bonds. Wire bonding provides an electrical interconnect between the active surface of the die and bond sites on a leadframe or bond fingers on the substrate, which in turn provide connectivity to other circuitry external to the semiconductor package.

Numerous package approaches have made use of multiple integrated circuit die or package-in-package (PiP) structures. Other approaches use package level stacking or package-on-package (PoP) arrangements. Both approaches involve the stacking of two or more devices or packages within a package.

Figure 1:
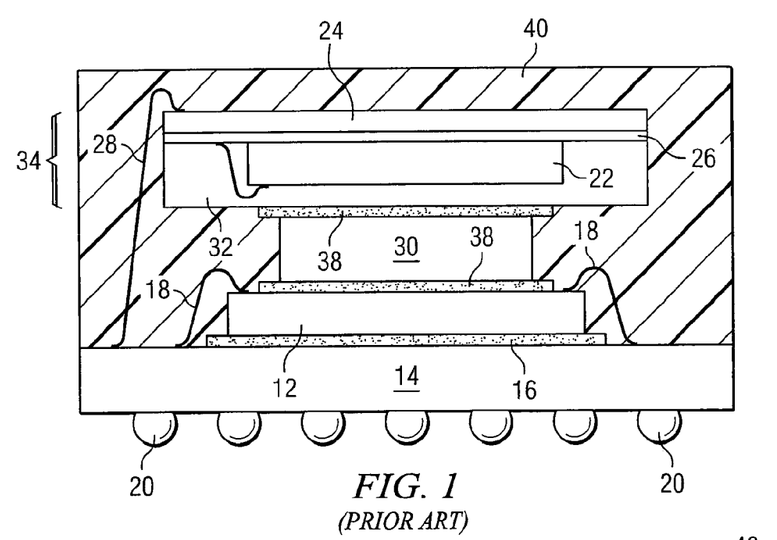
FIG. 1 illustrates a prior art package-in-package containing semiconductor die and ISM separated by a dummy spacer.

FIG. 1 illustrates one known PiP structure. Semiconductor die 12 is attached to substrate 14 with die attach adhesive 16. Bond wires 18 make electrical contact between bond pads on semiconductor die 12 and solder balls 20 to transfer electrical signals into and out of the package. Similarly, semiconductor die 22 is attached to substrate 24 with die attach adhesive 26. Bond wires 28 make electrical contact between bond pads on semiconductor die 22 and solder balls 20 to transfer electrical signals into and out of the package. An encapsulant 32 seals semiconductor die 28 to form internal stacking module (ISM) 34. A dummy spacer 30 separates semiconductor die 12 and ISM 34, and provides structural support for the package. Adhesive 38 secures dummy spacer 30 to semiconductor die 12 and ISM 34.

Figure 2:
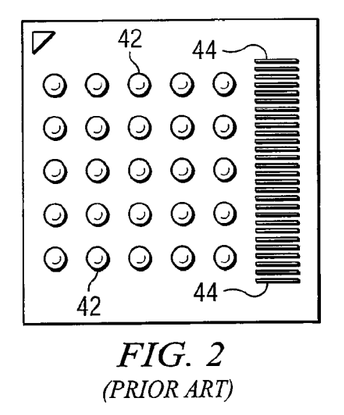
FIG. 2 illustrates a top view of a prior art ISM with package test pads and bond finger pads.
Figure 3A:
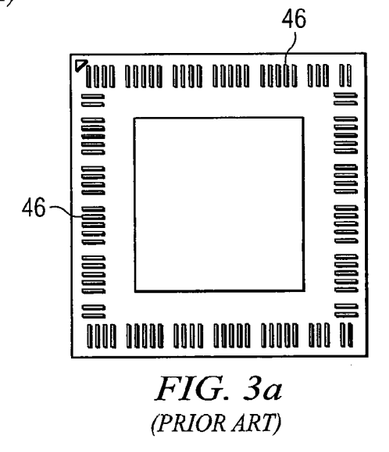
FIGS. 3a-3b illustrate top and bottom views of a prior art DSM ISM with bond finger pads and package test pads.
Figure 3B:
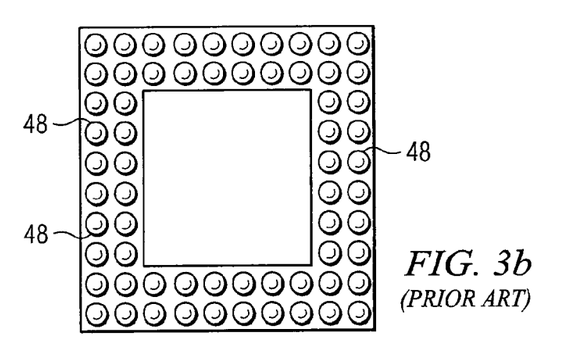

FIG. 2 shows a top view of an ISM with package test pads 42 and bond finger pads 44. FIG. 3a shows a top view of a double side mold (DSM) ISM with bond finger pads 46. FIG. 3b is a bottom view of the DSM ISM with package test pads 48.

There is an ever-increasing demand for semiconductor devices having more capability. The semiconductor package must be able to accommodate more semiconductor devices, i.e., greater device packing density, within the package. The aforedescribed dummy spacer requires significant space and places demands on the headroom of the package. The dummy spacer reduces the space available for semiconductor device and thereby decreases the packing density of the PiP structure.

In view of the ever-increasing need to save costs and improve efficiencies, a need exists for an integrated circuit (IC) package-to-package stacking system that provides low-cost manufacturing, improved yield, reduces the package size and dimensions, increases semiconductor device packing density, and provides flexible stacking and integration configurations for the semiconductor die.

SUMMARY OF THE INVENTION

Accordingly, in one embodiment, the present invention is a semiconductor package comprising a substrate having a plurality of solder balls and a first semiconductor die disposed on the substrate. A first DSM ISM is in physical contact with the first semiconductor die through a first adhesive. The first DSM ISM has second and third semiconductor die disposed in the first DSM ISM. A first electrical contact connects the semiconductor die to a first one of the plurality of solder balls. A second electrical contact connects a platform extending from the first DSM ISM to a second one of the plurality of solder balls.

In another embodiment, the present invention is a semiconductor package comprising a substrate having a plurality of solder balls and a first semiconductor die disposed on the substrate. A plurality of DSM ISM overlays the first semiconductor die. Each DSM ISM is in physical contact with an adjacent DSM ISM through an adhesive. Each DSM ISM has a plurality of semiconductor die disposed in the DSM ISM. A first electrical contact is coupled between the semiconductor die and a first one of the plurality of solder balls. A second electrical contact is coupled between a platform extending from one of the plurality of DSM ISM and a second one of the plurality of solder balls.

In another embodiment, the present invention is a semiconductor package comprising a substrate having a plurality of solder balls and a first semiconductor die disposed on the substrate. A first DSM ISM is disposed over the first semiconductor die through a first adhesive to reduce headroom of the semiconductor package.

In another embodiment, the present invention is a method of method of making a semiconductor package comprising the steps of providing a substrate having a plurality of solder balls, disposing a first semiconductor die on the substrate, and disposing a first DSM ISM over the first semiconductor die through a first adhesive to reduce headroom of the semiconductor package.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The term "horizontal" as used herein is defined as a plane parallel to the plane or surface of the outer leads, regardless of their orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" as used herein includes deposition of material or photoresist, patterning, exposure, development, etching, cleaning, and/or removal of the material or photoresist as required in forming a described structure.

The manufacture of semiconductor devices begins with the formation of a wafer having a plurality of die. Each die contains hundreds or thousands of transistors and other electrical devices for performing one or more electrical functions. For a given wafer, each die from the wafer typically performs the same electrical function. Front-end manufacturing generally refers to formation of the transistors and other devices on the wafer. Back-end manufacturing refers to cutting or singulating the finished wafer into the individual die and then packaging the die for electrical interconnect, structural support, and environmental isolation.

Figure 4:
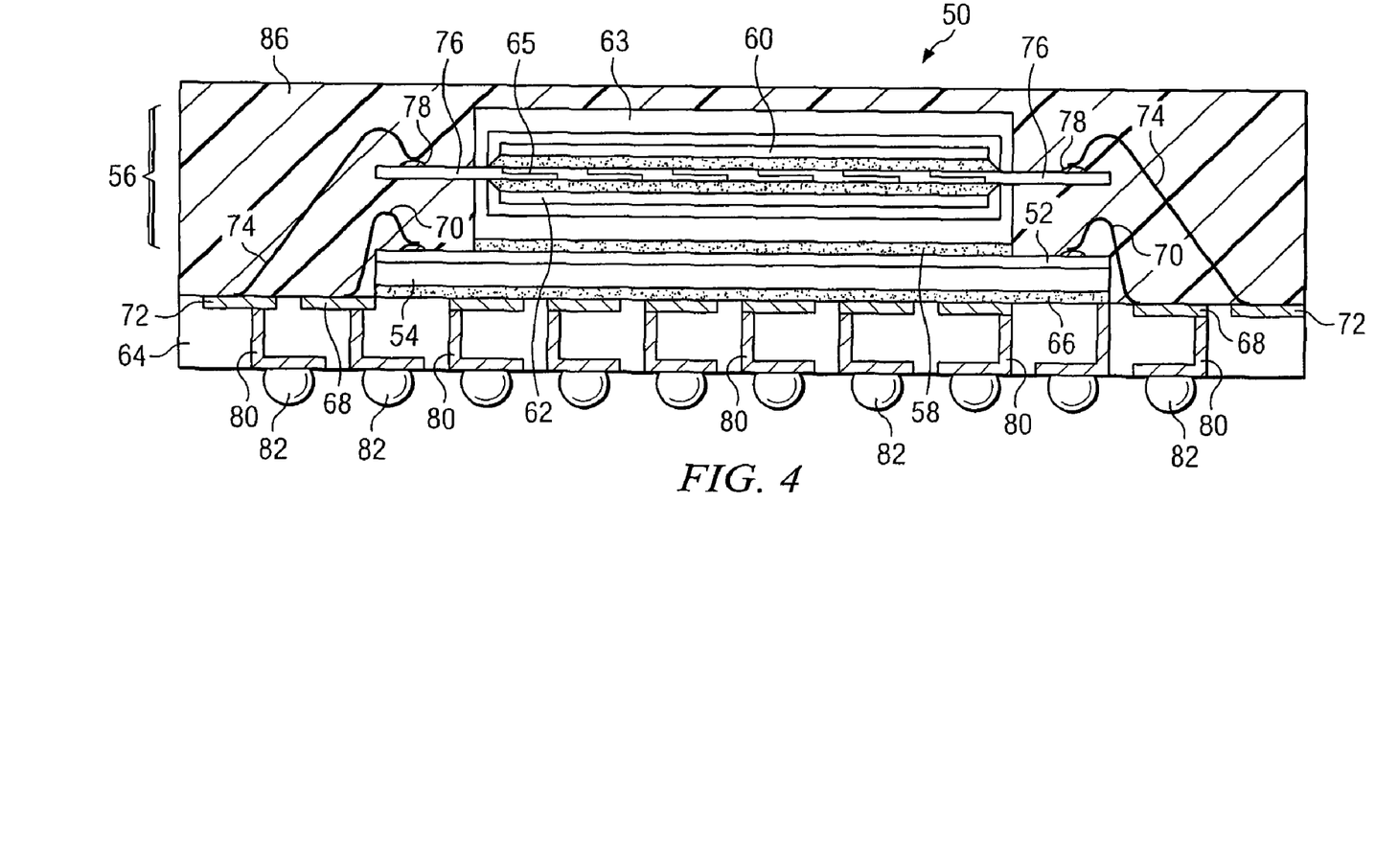
FIG. 4 illustrates a PiP structure using a DSM ISM for a plurality of semiconductor devices.

In FIG. 4, a PiP structure 50 is shown using a double side mold (DSM) process for internal stacking modules (ISM) to enclose a plurality of semiconductor die. Semiconductor die 52 is disposed on substrate 54. A DSM ISM 56 is attached to semiconductor die 52 with die attach adhesive 58, such as a thermal epoxy. DSM ISM 56 is directly attached to and in physical contact with semiconductor 52 by way of adhesive 58 to reduce headroom requirements and increase device packing density. DSM ISM 56 includes two semiconductor die 60 and 62. The semiconductor die 60 and 62 are enclosed in physically isolated cavities defined by substrate 63 of DSM ISM 56 for structural support. Semiconductor die 60 and 62 are electrically connected with metal traces and vias 65. In one embodiment, semiconductor die 60 and 62 are memory devices.

Semiconductor die 52 and DSM ISM 56 are attached to circuit carrier substrate 64 with adhesive 66. Semiconductor 52 is electrically connected to bonding pads 68 on substrate 64 by way of bond wires 70. Likewise, DSM ISM 56 is electrically connected to bonding pads 72 on substrate 64 by way of bond wires 74. DSM ISM 56 includes platforms 76 extending laterally from substrate 63. Platforms 76 have bonding pads 78 to attach bond wires 74. Bonding pads 68 and 72 electrically connect through conductive vias 80 to solder balls 82. The electrical signals transfer in and out through the solder balls, conductive vias, and wire bonds to the semiconductor die within the PiP structure.

An encapsulating material 86, such as a molding compound, is deposited over the DSM ISM and semiconductor die. The encapsulating material protects the devices from contaminants and provides structural integrity to the package.

The wire bonds are formed using a capillary bonding tool, a support for the device to be wire-bonded, a source of heat, a source and transducer to impart ultrasound vibration to the capillary bonding tool, and automated control for coordinating the movement and function of these machinery elements. Bond wires 70 and 74 can be made of aluminum or gold.

The PiP structure 50 provides greater storage capacity of semiconductor die by eliminating a dummy spacer between the semiconductor die and ISM within the package. The PiP structure 50 reduces the height and size of the package as compared to prior art FIG. 1 and thereby increases overall device packing density.

Figure 5:
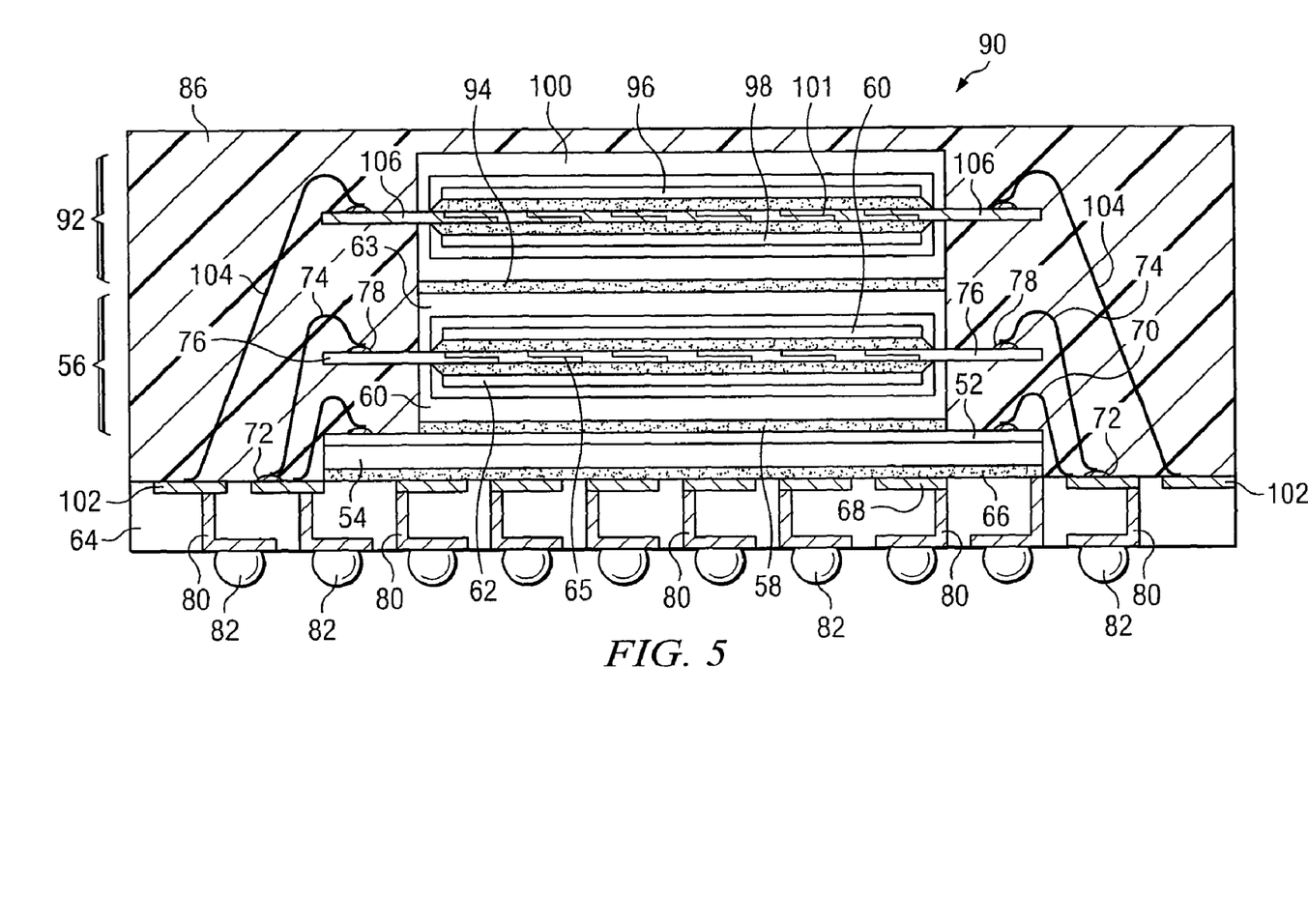
FIG. 5 illustrates a PiP structure with two stacked DSM ISMs.

FIG. 5 illustrates a PiP structure 90 with two stacked DSM ISMs. Components have the same reference number provide a similar function. Semiconductor die 52 is disposed on substrate 54. DSM ISM 56 is attached to semiconductor die 52 with die attach adhesive 58. DSM ISM 56 is directly attached to and in physical contact with semiconductor 52 by way of adhesive 58 to reduce headroom requirements and increase device packing density. DSM ISM 56 includes two semiconductor die 60 and 62. The semiconductor die 60 and 62 are enclosed in physically isolated cavities defined by substrate 63 of DSM ISM 56 for structural support. Semiconductor die 60 and 62 are electrically connected with metal traces and vias 65.

DSM ISM 92 is directly attached to and in physical contact with DSM ISM 56 by way of adhesive 94 to reduce headroom requirements and increase device packing density. DSM ISM 92 includes two semiconductor die 96 and 98. The semiconductor die 96 and 98 are enclosed in substrate 100 of DSM ISM 92 for structural support. Semiconductor die 96 and 98 are electrically connected with metal traces and vias 101.

Semiconductor die 52 is attached to circuit carrier substrate 64 with adhesive 66. Semiconductor 52 is electrically connected to bonding pads 68 on substrate 64 by way of bond wires 70. DSM ISM 56 is electrically connected to bonding pads 72 on substrate 64 by way of bond wires 74. DSM ISM 56 includes platforms 76 extending laterally from substrate 63. Platforms 76 have bonding pads 78 to attach bond wires 74. Likewise, DSM ISM 92 is electrically connected to bonding pads 102 on substrate 64 by way of bond wires 104. DSM ISM 92 includes platforms 106 extending laterally from substrate 100. Platforms 76 have bonding pads 78 to attach bond wires 74. Bonding pads 68, 72, and 102 electrically connect through conductive vias 80 to solder balls 82. The electrical signals transfer in and out through the solder balls, conductive vias, and wire bonds to the semiconductor die within the PiP structure.

An encapsulating material 86 is deposited over the DSM ISM and semiconductor die. The encapsulating material protects the devices from contaminants and provides structural integrity to the package.

The PiP structure 90 provides greater storage capacity of semiconductor die by eliminating a dummy spacer between the semiconductor die and ISM within the package. Storage capacity can be increased even further by stacking multiple DSM ISMs without a significant increase in vertical headroom. The PiP structure 90 reduces the height and size of the package and increases overall device packing density.

Figure 6:
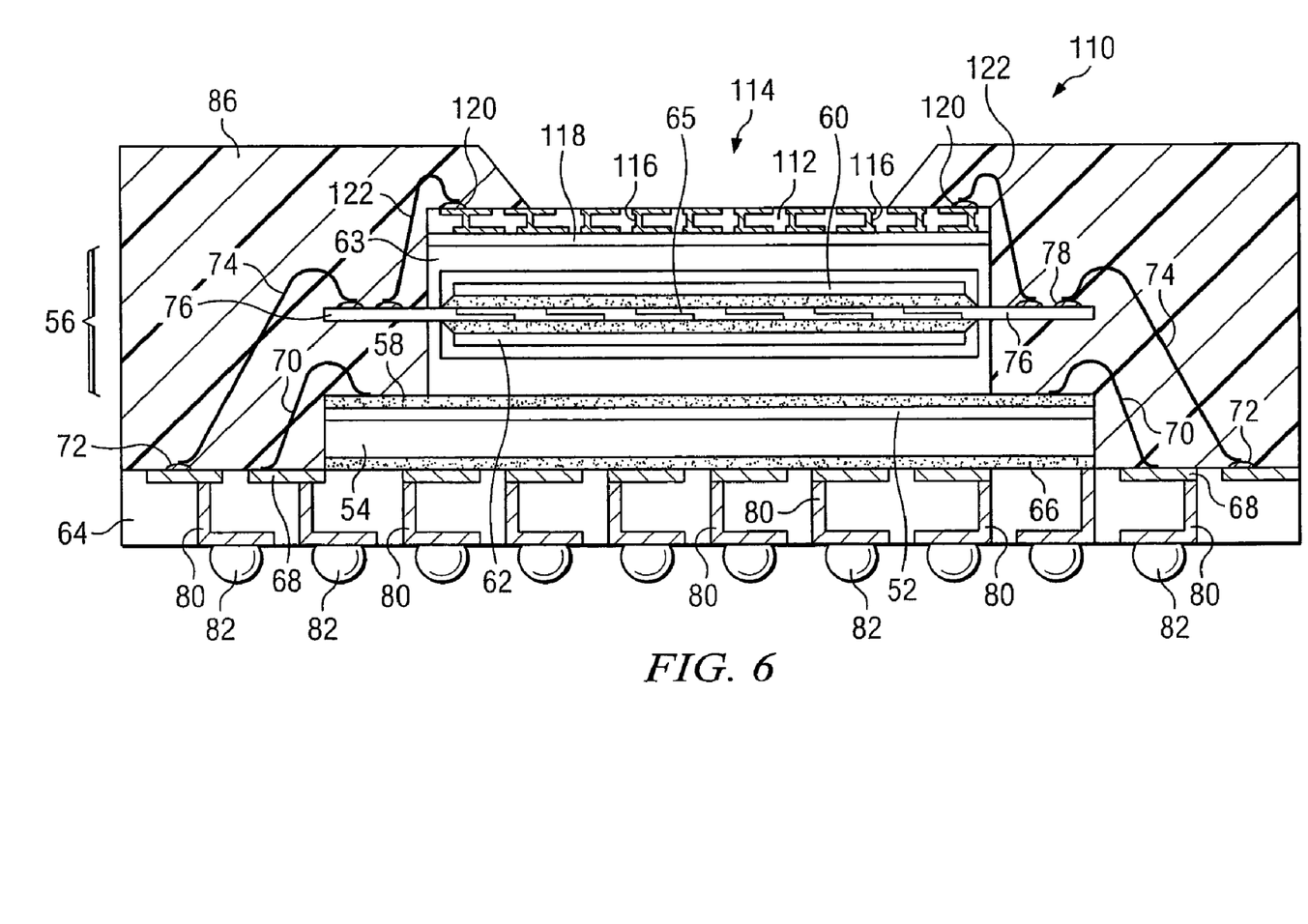
FIG. 6 illustrates a PiP structure with exposed top mold area using an interposer.

In FIG. 6, a PiP structure 110 is shown using a DSM process to enclose a plurality of semiconductor die. Semiconductor die 52 is disposed on substrate 54. DSM ISM 56 is attached to semiconductor die 52 with die attach adhesive 58.

DSM ISM 56 is directly attached to and in physical contact with semiconductor 52 by way of adhesive 58 to reduce headroom requirements and increase device packing density. DSM ISM 56 includes two semiconductor die 60 and 62. The semiconductor die 60 and 62 are enclosed in physically isolated cavities defined by substrate 63 of DSM ISM 56 for structural support. Semiconductor die 60 and 62 are electrically connected with metal traces and vias 65.

Semiconductor die 52 is attached to circuit carrier substrate 64 with adhesive 66. Semiconductor 52 is electrically connected to bonding pads 68 on substrate 64 by way of bond wires 70. Likewise, DSM ISM 56 is electrically connected to bonding pads 72 on substrate 64 by way of bond wires 74. DSM ISM 56 includes platforms 76 extending laterally from substrate 63. Platforms 76 have bonding pads 78 to attach bond wires 74. Bonding pads 68 and 72 electrically connect through conductive vias 80 to solder balls 82. The electrical signals transfer in and out through the solder balls, conductive vias, and wire bonds to the semiconductor die within the PiP structure.

An encapsulating material 86 is deposited over the DSM ISM and semiconductor die. The encapsulating material protects the devices from contaminants and provides structural integrity to the package.

An interposer 112 is disposed between a top surface of DSM ISM 56 and exposed mold area 114 of encapsulating material 86. The interposer 112 contains electrical contacts 116 and is attached to DSM ISM 56 with adhesive 118. The interposer 112 has wire bond pads 120 for connecting wire bond 122 to wire bond pads 76 on platform 78 of DSM ISM 56.

The PiP structure 110 provides greater storage capacity of semiconductor die by eliminating a dummy spacer between the semiconductor die and ISM within the package. The PiP structure 110 reduces the height of the package and increases overall device packing density.

Figure 7:
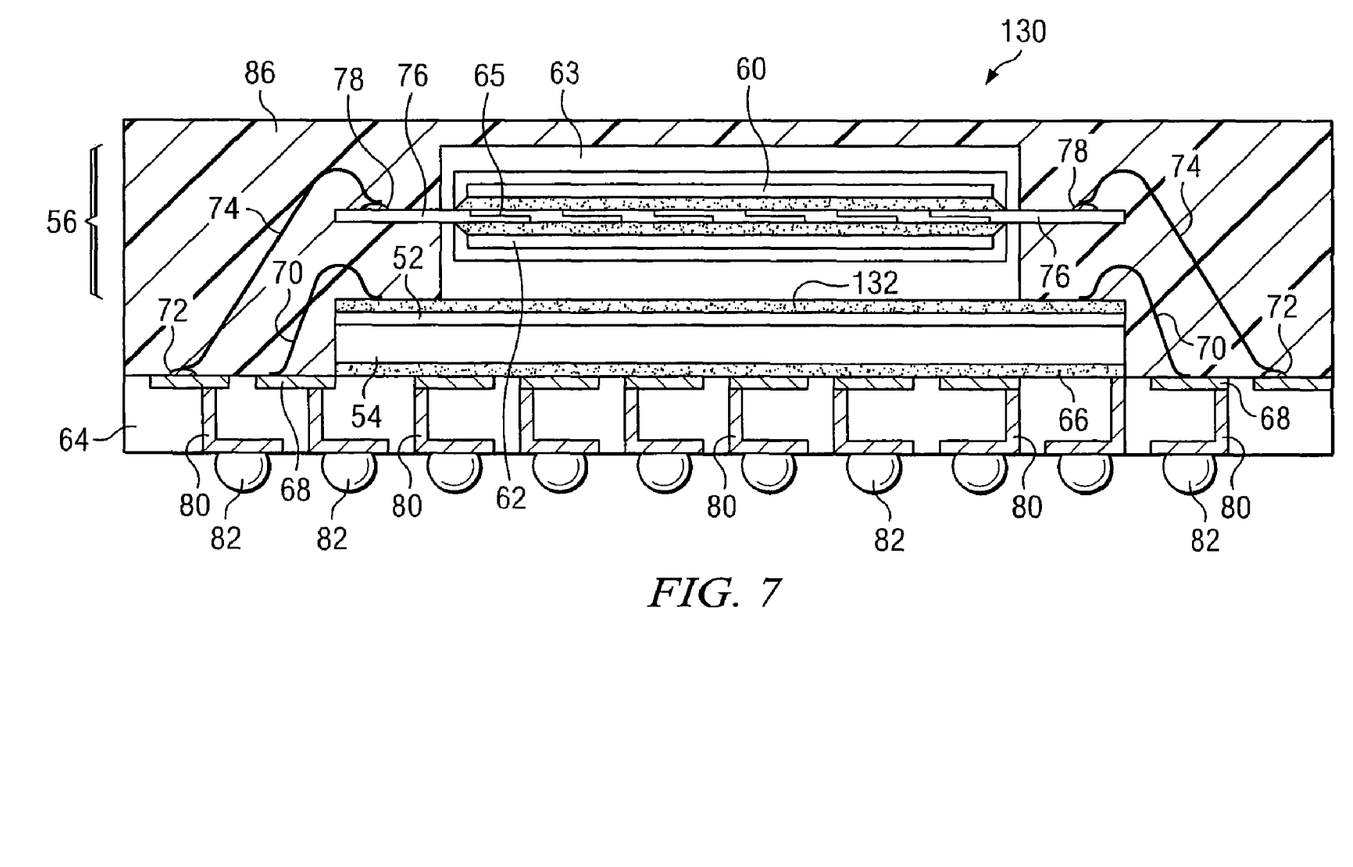
FIG. 7 illustrates a PiP structure using a film on wire adhesive between the DSM ISM and semiconductor die.

In FIG. 7, a PiP structure 130 is shown using a DSM process to enclose a plurality of semiconductor die. Semiconductor die 52 is disposed on substrate 54. A DSM ISM 56 is attached to semiconductor die 52 with film adhesive 132, also known as "film on wire." DSM ISM 56 is directly attached to and in physical contact with semiconductor 52 by way of film adhesive 132 to reduce headroom requirements and increase device packing density. DSM ISM 56 includes two semiconductor die 60 and 62. The semiconductor die 60 and 62 are enclosed in physically isolated cavities defined by substrate 63 of DSM ISM 56 for structural support. Semiconductor die 60 and 62 are electrically connected with metal traces and vias 65.

Semiconductor die 52 is attached to circuit carrier substrate 64 with adhesive 66. Semiconductor 52 is electrically connected to bonding pads 68 on substrate 64 by way of bond wires 70. Likewise, DSM ISM 56 is electrically connected to bonding pads 72 on substrate 64 by way of bond wires 74. DSM ISM 56 includes platforms 76 extending laterally from substrate 63. Platforms 76 have bonding pads 78 to attach bond wires 74. Bonding pads 68 and 72 electrically connect through conductive vias 80 to solder balls 82. The electrical signals transfer in and out through the solder balls, conductive vias, and wire bonds to the semiconductor die within the PiP structure.

An encapsulating material 86 is deposited over the DSM ISM and semiconductor die. The encapsulating material protects the devices from contaminants and provides structural integrity to the package.

The PiP structure 130 provides greater storage capacity of semiconductor die by eliminating a dummy spacer between the semiconductor die and ISM within the package. The PiP structure 130 reduces the height of the package and increases overall device packing density.

Figure 8:
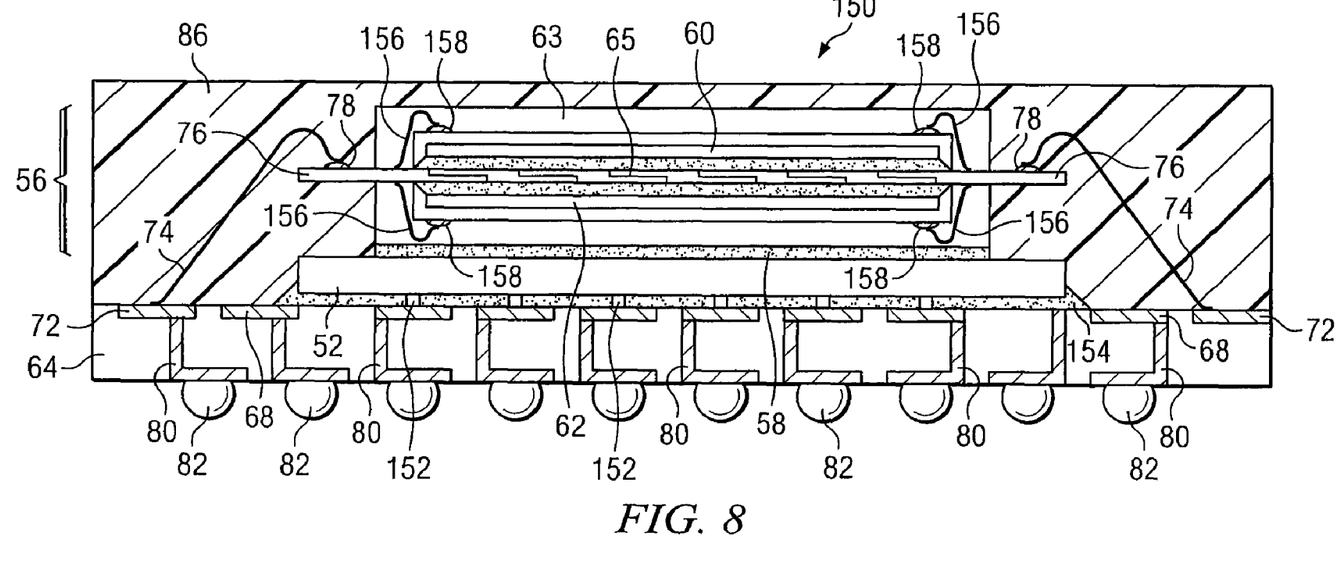
FIG. 8 illustrates a PiP structure with a flipchip and DSM ISM for a plurality of semiconductor devices.

In FIG. 8, a PiP structure 150 is shown with semiconductor die 52 disposed on substrate 64. In this embodiment, semiconductor 52 is a flipchip device. Semiconductor device 52 makes electrical contact with conductive vias 80 and solder balls 82 by way of electric contacts 152, typically implemented with the solder balls of the flipchip device. An underfill material 154 is disposed between semiconductor die 52 and substrate 64.

DSM ISM 56 is attached to semiconductor die 52 with die attach adhesive 58. DSM ISM 56 is directly attached to and in physical contact with semiconductor 52 by way of adhesive 58 to reduce headroom requirements and increase device packing density. DSM ISM 56 includes two semiconductor die 60 and 62. The semiconductor die 60 and 62 are enclosed in physically isolated cavities defined by substrate 63 of DSM ISM 56 for structural support. Semiconductor die 60 and 62 are electrically connected with metal traces and vias 65. In addition, semiconductor die 60 and 62 can be connected through metal traces and vias 65 using bond wires 156 connected to bond pads 158. In one embodiment, semiconductor die 60 and 62 are memory devices.

DSM ISM 56 includes platforms 76 extending laterally from substrate 63. Platforms 76 have bonding pads 78 to attach bond wires 74. DSM ISM 56 is electrically connected to bonding pads 72 on substrate 64 by way of bond wires 74. Bonding pads 68 and 72 electrically connect through conductive vias 80 to solder balls 82. The electrical signals transfer in and out through the solder balls, conductive vias, and wire bonds to the semiconductor die within the PiP structure.

An encapsulating material 86, such as a molding compound, is deposited over the DSM ISM and semiconductor die. The encapsulating material protects the devices from contaminants and provides structural integrity to the package.

The PiP structure 150 provides greater storage capacity of semiconductor die by eliminating a dummy spacer between the semiconductor die and ISM within the package. The PiP structure 150 reduces the height and size of the package and increases overall device packing density.

Figure 9:
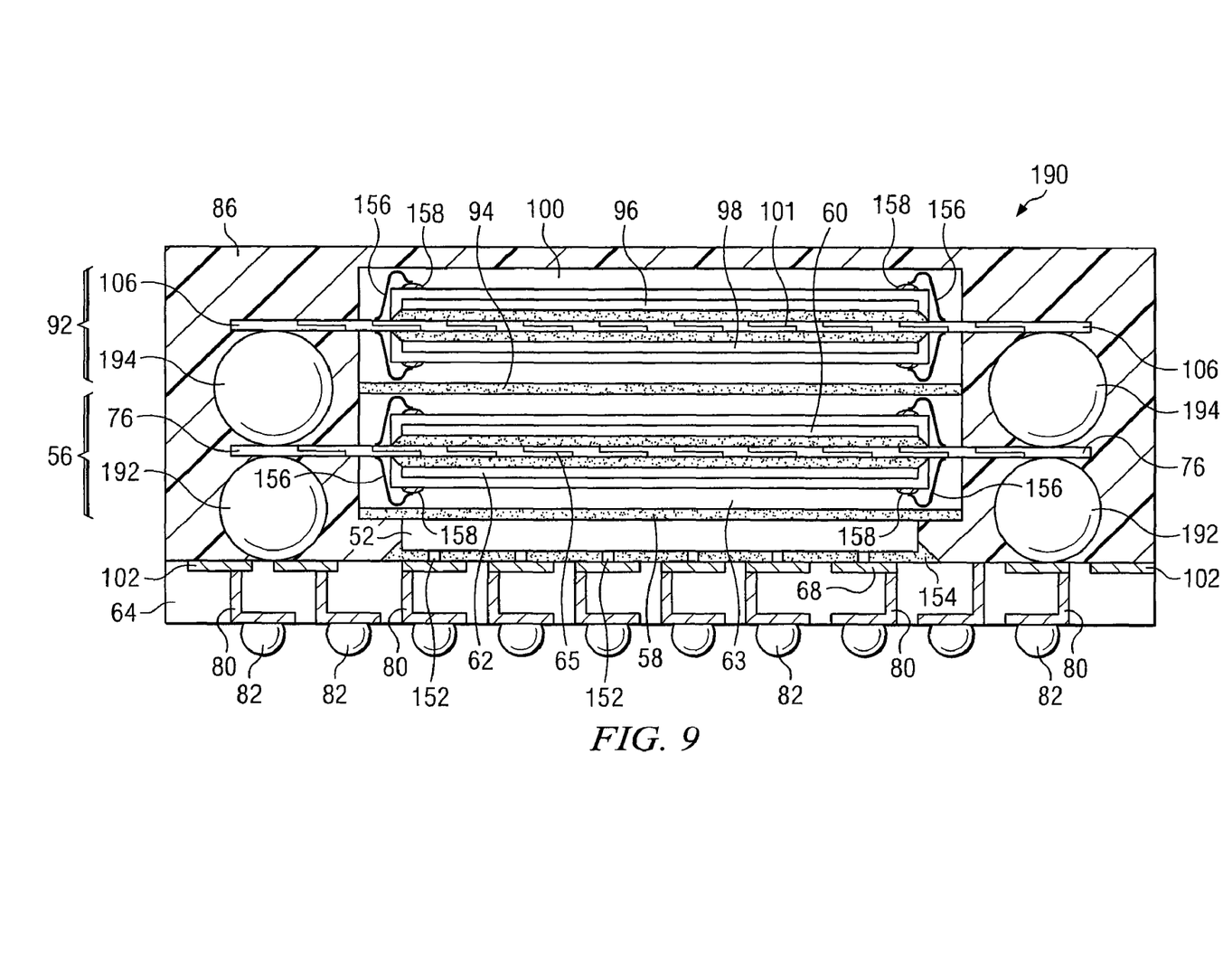
FIG. 9 illustrates a PiP structure with a flipchip and two stacked DSM ISMs.

FIG. 9 illustrates a PiP structure 190 with two stacked DSM ISMs. Components have the same reference number provide a similar function. Semiconductor die 52 is disposed on substrate 64. In this embodiment, semiconductor 52 is a flipchip device. Semiconductor device 52 makes electrical contact with conductive vias 80 and solder balls 82 by way of electric contacts or solder balls 152 of the flipchip device. An underfill material 154 is disposed between semiconductor die 52 and substrate 64.

DSM ISM 56 is attached to semiconductor die 52 with die attach adhesive 58. DSM ISM 56 is directly attached to and in physical contact with semiconductor 52 by way of adhesive 58 to reduce headroom requirements and increase device packing density. DSM ISM 56 includes two semiconductor die 60 and 62. The semiconductor die 60 and 62 are enclosed in physically isolated cavities defined by substrate 63 of DSM ISM 56 for structural support. Semiconductor die 60 and 62 are electrically connected with metal traces and vias 65. In addition, semiconductor die 60 and 62 can be connected through metal traces and vias 65 using bond wires 156 connected to bond pads 158.

DSM ISM 92 is directly attached to and in physical contact with DSM ISM 56 by way of adhesive 94 to reduce headroom requirements and increase device packing density. DSM ISM 92 includes two semiconductor die 96 and 98. The semiconductor die 96 and 98 are enclosed in substrate 100 of DSM ISM 92 for structural support. Semiconductor die 96 and 98 are electrically connected with metal traces and vias 101. In addition, semiconductor die 96 and 98 can be connected through metal traces and vias 101 using bond wires 156 connected to bond pads 158.

DSM ISM 56 includes platforms 76 extending laterally from substrate 63. Platforms 76 have bonding pads 78 to attach bond wires 74. DSM ISM 56 is electrically connected to bonding pads 72 on substrate 64 by way of solder balls 192. Thus, electrical signals transfer in and out of semiconductor die 60 and 62 through platforms 76 and solder balls 192 to conductive vias 80 to solder balls 82. Likewise, DSM ISM 92 includes platforms 106 extending laterally from substrate 100. Platforms 106 electrically connect to platforms 76 with solder balls 194. The electrical signals transfer in and out of semiconductor die 96 and 98 through platforms 106, solder balls 194, platforms 76, and solder balls 192 to conductive vias 80 to solder balls 82.

An encapsulating material 86 is deposited over the DSM ISM and semiconductor die. The encapsulating material protects the devices from contaminants and provides structural integrity to the package.

The PiP structure 190 provides greater storage capacity of semiconductor die by eliminating a dummy spacer between the semiconductor die and ISM within the package. Storage capacity can be increased even further by stacking multiple DSM ISMs without a significant increase in vertical headroom. The PiP structure 190 reduces the height and size of the package and increases overall device packing density.

While one or more embodiments of the present invention have been illustrated in detail, the skilled artisan will appreciate that modifications and adaptations to those embodiments may be made without departing from the scope of the present invention as set forth in the following claims.

What is claimed is:

1. A semiconductor package, comprising:
   a first substrate having a plurality of solder balls;
   a first semiconductor die mounted to the first substrate;
   a first double side mold (DSM) internal stackable module (ISM) in physical contact with the first semiconductor die through a first adhesive to reduce a height of the semiconductor package, the first DSM ISM including,
   (a) a second substrate having first and second cavities,
   (b) a second semiconductor die disposed in the first cavity of the second substrate,
   (c) a third semiconductor die disposed in the second cavity of the second substrate, and
   (d) a platform disposed between the second semiconductor die and third semiconductor die and extending beyond the second substrate, the second semiconductor die being electrically connected to the third semiconductor die through conductive traces formed in the platform;
   a first electrical contact connecting the first semiconductor die to a first one of the plurality of solder balls; and
   a second electrical contact connecting the platform to a second one of the plurality of solder balls, wherein the second electrical contact is a solder ball.

2. The semiconductor package of claim 1, further including a second DSM ISM in physical contact with the first DSM ISM through a second adhesive, the second DSM ISM including fourth and fifth semiconductor die disposed in the second DSM ISM.

3. The semiconductor package of claim 1, further including a third electrical contact coupled between a platform extending from the second DSM ISM and a third one of the plurality of solder balls.

4. The semiconductor package of claim 1, further including an encapsulant surrounding the first semiconductor die and first DSM ISM.

5. The semiconductor package of claim 4, further including an interposer disposed above the first DSM ISM, the interposer being electrically connected to the platform of the first DSM ISM.

6. The semiconductor package of claim 5, further including an exposed mold area in the encapsulant above the interposer.

7. A semiconductor package, comprising:
   a first substrate;
   a first semiconductor die mounted to the first substrate;
   a first double side mold (DSM) internal stackable module (ISM) in physical contact with the first semiconductor die through a first adhesive to reduce a height of the semiconductor package, the first DSM ISM including,
   (a) a second substrate having first and second cavities,
   (b) a second semiconductor die disposed in the first cavity of the second substrate,
   (c) a third semiconductor die disposed in the second cavity of the second substrate, and
   (d) a platform disposed between the second semiconductor die and third semiconductor die and extending beyond the second substrate;
   a second DSM ISM in physical contact with the first DSM ISM through a second adhesive, the second DSM ISM including fourth and fifth semiconductor die disposed in the second DSM ISM;
   a first electrical connection coupled between the first semiconductor die and first substrate; and
   a second electrical connection coupled between the platform and first substrate.

8. The semiconductor package of claim 7, wherein the second semiconductor die is electrically connected to the third semiconductor die through conductive traces formed in the platform.

9. The semiconductor package of claim 7, wherein the second electrical contact includes a bond wire or solder bump.

10. The semiconductor package of claim 7, further including an encapsulant deposited over the first semiconductor die and first DSM ISM.

11. The semiconductor package of claim 7, further including an interposer disposed over the first DSM ISM, the interposer being electrically connected to the platform.

12. A semiconductor package, comprising:
   a first substrate;
   a first semiconductor die mounted to the first substrate;
   a first double side mold (DSM) internal stackable module (ISM) in physical contact with the first semiconductor die through a first adhesive to reduce a height of the semiconductor package;
   a second DSM ISM in physical contact with the first DSM ISM through a second adhesive, the second DSM ISM including fourth and fifth semiconductor die disposed in the second DSM ISM;
   a first electrical connection coupled between the first semiconductor die and first substrate; and
   a second electrical connection coupled between the first DSM ISM and first substrate.

13. The semiconductor package of claim 12, wherein the first DSM ISM includes:
- a second substrate having first and second cavities;
- a second semiconductor die disposed in the first cavity of the second substrate;
- a third semiconductor die disposed in the second cavity of the second substrate; and
- a platform disposed between the second semiconductor die and third semiconductor die and extending beyond the second substrate.

14. The semiconductor package of claim 13, wherein the second semiconductor die is electrically connected to the third semiconductor die through conductive traces formed in the platform.

15. The semiconductor package of claim 12, wherein the second electrical contact includes a bond wire or solder bump.

16. The semiconductor package of claim 12, further including an encapsulant deposited over the first semiconductor die and first DSM ISM.

17. The semiconductor package of claim 12, further including an interposer disposed over the first DSM ISM, the interposer being electrically connected to the platform.

* * * * *